(12) United States Patent
Hamamoto et al.

(10) Patent No.: US 6,870,086 B2
(45) Date of Patent: Mar. 22, 2005

(54) THERMO PILE INFRARED RAY SENSOR MANUFACTURED WITH SCREEN PRINT AND METHOD THEREOF

(75) Inventors: Kazuaki Hamamoto, Nagoya (JP); Takahiko Yoshida, Okazaki (JP); Yasutoshi Suzuki, Okazaki (JP); Inao Toyoda, Anjo (JP)

(73) Assignees: Denso Corporation, Kariya (JP); Nippon Soken, Inc, Nishio (JP)

( * ) Notice: Subject to any disclaimer, the term of this patent is extended or adjusted under 35 U.S.C. 154(b) by 324 days.

(21) Appl. No.: 10/164,603

(22) Filed: Jun. 10, 2002

(65) Prior Publication Data

US 2002/0185169 A1 Dec. 12, 2002

(30) Foreign Application Priority Data

| Jun. 11, 2001 | (JP) | ................................. | 2001-176138 |
| Jul. 16, 2001 | (JP) | ................................. | 2001-215183 |
| Nov. 6, 2001 | (JP) | ................................. | 2001-341066 |

(51) Int. Cl.[7] ............................. H01L 35/28; B05D 5/12
(52) U.S. Cl. ...................................... 136/225; 427/58
(58) Field of Search .......................... 136/224, 225; 427/58

(56) References Cited

U.S. PATENT DOCUMENTS 6,348,650 B1 * 2/2002 Endo et al. ................. 136/201
6,720,559 B2 * 4/2004 Kubo ....................... 250/338.1

FOREIGN PATENT DOCUMENTS

| JP | B2-55-17104   | 5/1980  |
| JP | B2-57-29683   | 6/1982  |
| JP | A-62-222134   | 9/1987  |
| JP | A-5-231926    | 9/1993  |
| JP | A-5-231946    | 9/1993  |
| JP | A-6-109535    | 4/1994  |
| JP | A-9-133578    | 5/1997  |
| JP | A-2000-340848 | 12/2000 |

* cited by examiner

*Primary Examiner*—Patricia Ryan
*Assistant Examiner*—Thomas H. Parsons
(74) *Attorney, Agent, or Firm*—Posz & Bethards, PLC

(57) ABSTRACT

In a thermo pile infrared ray sensor, an opening portion is formed by etching a substrate from a second surface after an n-type poly-Si layer and a thin aluminium layer are formed so that first and second connection portions are formed by parts thereof. An infrared ray absorbent layer is formed on the substrate to cover the first connection portion with a screen print after the opening portion is formed.

6 Claims, 10 Drawing Sheets

FIG. 9A FIG. 9B
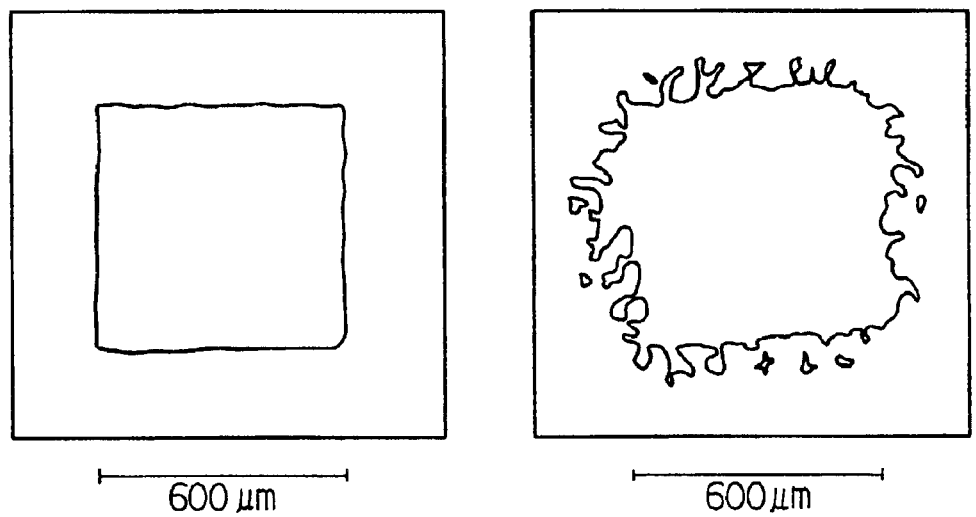
|← 600 μm →|  |← 600 μm →|
FIG. 10
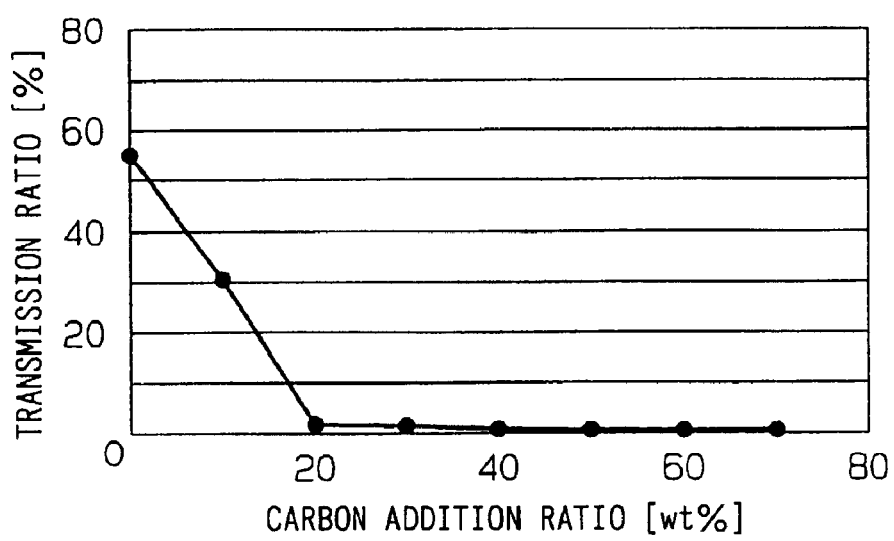

THERMO PILE INFRARED RAY SENSOR MANUFACTURED WITH SCREEN PRINT AND METHOD THEREOF

CROSS REFERENCE TO RELATED APPLICATIONS

This application is based upon and claims the benefit of Japanese Patent Application No. 2001-176138 filed on Jun. 11, 2001, No. 2001-215183 filed on Jul. 16, 2001, and No. 2001-341066 filed on Nov. 6, 2001, the contents of which are incorporated herein by reference.

FIELD OF THE INVENTION

The present invention relates to a thermo pile infrared ray sensor and manufacturing method thereof having an infrared ray absorbent layer that absorbs infrared rays thereon.

DESCRIPTION OF THE RELATED

In a conventional infrared ray sensor, a gold-black layer made of gold ultra-fine particles having a high infrared ray absorbency ratio or carbon layer is usually adopted as an infrared ray absorbent material that absorbs infrared rays and exchanges the absorbed rays into heat. For example, JP-B-55-17104 discloses a manufacturing process of a gold-black layer formed by depositing gold on a substrate at 0.1 Torr in as Argon gas atmosphere using a vacuum deposition apparatus and repeatedly depositing gold on the substrate at 1 Torr in the Argon gas atmosphere. On the other hand, JP-A-6-108535 discloses a manufacturing process of a carbon layer having a high infrared ray absorbency ratio and formed by resolving carbon hydride (e.g., methane, ethylene or acetylene) using vacuum glow discharging.

In JP-B-55-17104, to obtain a high adhesion strength of the conventional gold-black layer, the depositing of the gold is conducted twice. However, the resulting durability of the adhesion strength of the gold-black layer is insufficient. Further, the manufacturing cost of the gold-black layer increases because the manufacturing process is complex.

To the contrary, JP-B-57-29683 also discloses a manufacturing process of the gold-black layer. That is, a gold-black layer having a two-layer construction is formed by spraying carbon particles onto a substrate to form a foundation and then depositing the gold-black layer. However, the resulting durability of the adhesion strength of the gold-black layer is insufficient, too. Also, the manufacturing cost of the gold-black layer increases for the same reason as mentioned above.

The gold-black layer and the carbon layer formed by the above-mentioned manufacturing process are etched by photo lithography to pattern predetermined shape. Therefore, the manufacturing cost of the gold-black layer further increases because specialized equipment is required for the photolithography process such as, for example, a photolithography machine and a dry etching machine.

Further, in the manufacturing process disclosed in JP-A-6-109535, an infrared ray sensor diaphragm is formed to decrease thermal capacitance formed by the substrate and the infrared ray absorbent layer after the carbon layer is formed. However, the infrared ray sensor may be contaminated by carbon included in the infrared ray absorbent layer during the formation of the diaphragm.

Generally, a thermo pile infrared ray sensor includes a membrane formed in a thick portion of a substrate, a thermoelectric couple having a warm connection portion formed on the membrane and a cold connection portion formed on the periphery of the membrane, and an infrared ray absorbent layer formed on the membrane to cover the warm connection portion. The thermo pile infrared ray sensor detects infrared rays based on a voltage change generated between the thermoelectric couple when the infrared rays are irradiated thereon.

However, a thermo pile infrared ray sensor voltage is typically low. Specifically, a distance between the warm and cold portions of the thermoelectric couple, or heat separation width is often too large, or the membrane is too thick, to reduce the heat capacitance of the warm connection portion necessary to obtain a large voltage output because heat from the warm connection portion cannot easily escape and the temperature difference between the warm and cold connection portions of the thermoelectric couple becomes large.

Therefore, the substrate area must be increased to lengthen the heat separation width, or membrane material changes must be made to enable the heat to escape from the warm connection portion, thereby increasing the manufacturing cost of such a device.

SUMMARY OF THE INVENTION

It is therefore an object of the present invention to provide a manufacturing method for a thermo pile infrared ray sensor that obviates the above limitations.

It is another object of the present invention to provide a manufacturing method for a thermo pile infrared ray sensor that enables such a sensor to be manufactured at a low cost.

It is another object of the present invention to provide a thermo pile infrared ray sensor that obtains an appropriately output signal without a lengthened sensor tip.

In a thermo pile infrared ray sensor of the present invention, one of an opening portion and a depressed portion is formed by etching a substrate from a second surface after first and second material layers are formed so that a first and a second connection portions are formed based on parts of the first and second material layers. An infrared ray absorbent layer is formed on the substrate to cover the first connection portion with a screen print after one of the opening portion and a depressed portion is formed.

According to the infrared ray sensor of the present invention, the infrared ray absorbent layer cannot peel from the substrate because it is formed after the etching for the opening portion is performed. Therefore, a complex process that prevents the infrared ray absorbent layer from peeling is not needed, and the infrared ray sensor can be manufactured at a low cost.

In a thermo pile infrared ray sensor of the present invention, the infrared ray absorbent layer is formed so that a size ratio of a width of one of the opening and the depressed portion to a width of the infrared ray absorbent layer is 0.75 to 0.90.

According to the infrared ray sensor of the present invention, it is possible to increase sensor output without lengthening the sensor tip.

BRIEF DESCRIPTION OF THE DRAWINGS

Other objects, features and advantages of the present invention will be understood more fully from the following detailed description made with reference to the accompanying drawings. In the drawings:

FIGS. 9A and 9B are front views showing print conditions of polyester resin paste and phenol resin paste;

FIG. 10 is a line graph showing a relationship between a carbon addition ratio and an infrared ray transmission ratio;

DETAILED DESCRIPTION OF THE PREFERRED EMBODIMENT

Figure 1:
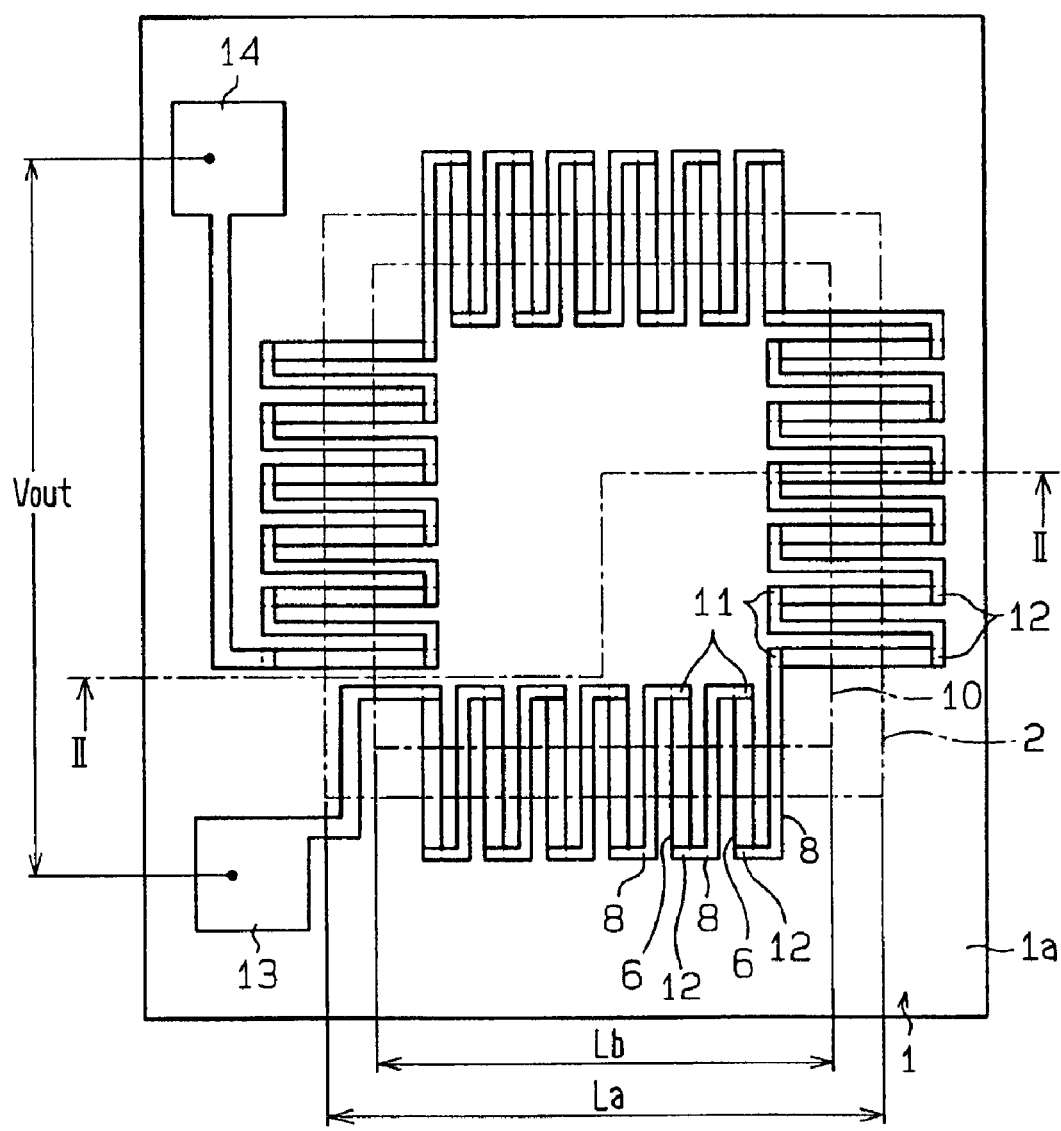
FIG. 1 is a front view showing a thermo pile infrared ray sensor according to a first embodiment of the present invention.

The present invention will be described further with reference to various embodiments shown in the drawings.

First Embodiment

Figure 2:
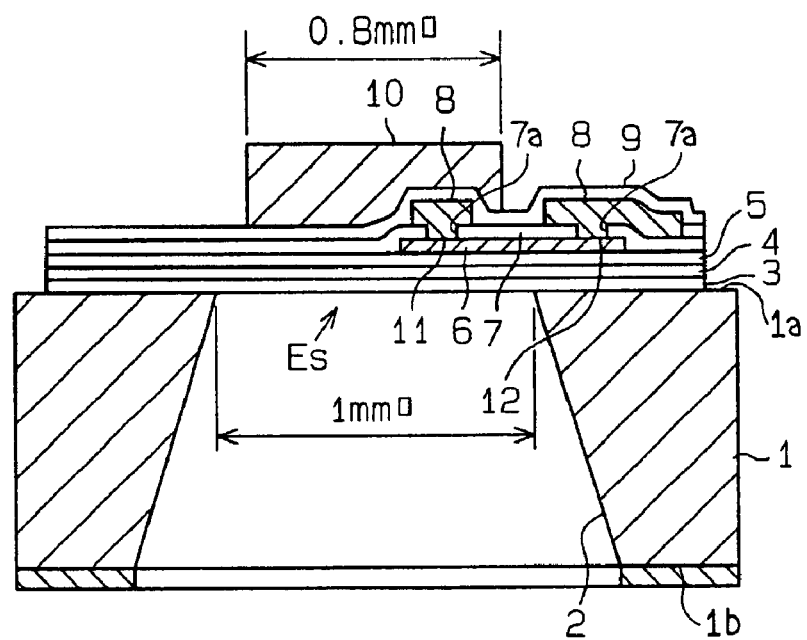
FIG. 2 is a cross sectional view taken along line IIB—IIB of FIG. 1.

Referring to FIGS. 1 and 2, a thermo pile infrared ray sensor (infrared ray sensor) is manufactured based on substrate 1. The substrate 1 is, for example, semiconductor substrate such as a single-crystal silicon substrate having a thickness of 400 μm and has a first surface 1a (upper surface in FIG. 2) and a second surface 1b (lower surface in FIG. 2). A surface direction of the first surface 1a is, for example, (100) plane or (110) plane. An opening portion 2 is formed in the substrate 1 to penetrate from the second surface 1b to the first surface 1a in a direction perpendicular to the substrate 1 by anisotropic etching. Length and breadth sizes (widths) of the opening portion 2 are approximately 1 mm.

Isolation layers 3, 4, 5 are formed on the first surface 1a of the substrate 1 to cover the opening portion 2. The isolation layer 3, 5 are made of silicon nitride and the isolation layer 4 is made of silicon oxide. The isolation layers 3–5 are respectively formed by CVD, sputter deposition or the like. The total thickness of the isolation layers 3–5 is, for example, 2 μm.

A poly-Si layer 6 doped with n-type impurities (n-type poly-Si layer) is formed by CVD or the like and is patterned on the isolation layers 3–5. An isolation layer 7 and a thin aluminum layer 8 are formed on the isolation layers 3–5 and the n-type poly-Si layer 6 by sputter deposition or the like. Contact holes 7a are formed in the isolation layer 7 through which the thin aluminum layer 8 and the n-type poly-Si layer 6 are contacted with each other. Specifically, parts of the thin aluminum layer and parts of the poly-Si layer 6 are alternatively patterned and respective parts are directly contacted with each other at both ends or one end thereof to form strip-shaped sensing wiring.

A passivating layer 9, which is made of a silicon oxide layer, TEOS layer or the like, is formed on the thin aluminium layer 8. An infrared ray absorbent layer 10 made of carbon is formed on a predetermined region of the passivating layer 9. For example, a thickness of the infrared ray absorbent layer 10 is approximately 6 μm and length and breadth sizes (widths) Lb of the infrared ray absorbent portion 10 are approximately 0.8 mm respectively.

The infrared ray absorbent layer 10 is rectangularly shaped and is arranged on the center of the substrate 1. First connection portions 11 of the n-type poly-Si layer 6 and the thin aluminium layer 8 are positioned under the infrared ray absorbent layer 10, while second connection portions 12 of the n-type poly-Si layer 6 and the thin aluminium layer 8 are positioned on the periphery of the infrared ray absorbent layer 10. That is, the second connection portions 12 are not positioned under the infrared ray absorbent layer 10.

As shown in FIG. 1, a first terminal 13 and a second terminal 14 are formed on the isolation layers 3–5. The first and second terminals 13, 14 respectively connect to ends of the series circuit formed by the n-type poly-Si layer 6 and the thin aluminium layer 8.

In this construction, a temperature of the first connection portions 11 increases when the infrared ray absorbent layer 10 absorbs infrared rays because the n-type poly-Si layer 6 and the thin aluminium layer 8 are different materials. Therefore, the first connection portions 11 positioned on the opening portion 2 and the second connection portions 12 positioned on the substrate 1 around the opening portion 2 construct thermoelectric coupling groups having Seebeck coefficient. The first connection portions 11 correspond to warm connection portions and the second connection portions 12 correspond to cold connection portions.

Also, in this construction, sensor elements Es shown in FIG. 2 are formed on a membrane having a thin layer and formed on the opening portion 2 of the substrate 1. Therefore, a heat capacitance of the first connection portions 11 is smaller than that of the second connection portions 12 formed on the substrate 1 except at the opening portion 2 because the substrate 1 acts a heat sink.

In the present infrared ray sensor, the infrared absorbent layer 10 absorbs and generates heat when infrared rays are incident thereon. The heat changes into an electromotive force between the thermoelectric couples. In detail, when the infrared absorbent layer 10 absorbs infrared rays emitted from a human body or the like, a temperature thereof increases. As a result, a temperature of the first connection portion 11 under the infrared absorbent layer 10 also increases. On the other hand, a temperature of the second connection portion 12 does not increase because the substrate 1 acts heat sink. Accordingly, a temperature difference is generated between the first and second connection portions 11, 12, and the electromotive force is, therefore, generated therebetween based on the Seebeck effect.

The electromotive force is detected from the first and second terminals 13, 14 of the series circuit as a sensor output signal Vout. Accordingly, infrared rays can be detected based on the electromotive force and a temperature of the human body or the like that generates the infrared rays. Incidentally, the electromotive force to be generated depends on the number of the thermoelectric couples. Accordingly, in the present embodiment, the number of the thermoelectric couples is set in a range from several dozen to hundreds to increase the sensor output.

A manufacturing process of the infrared ray sensor of the present embodiment is described with reference to FIGS. 3–6. FIGS. 3–6, which each show a cross sectional view of apart of the infrared ray sensor corresponding to FIG. 2.

Figure 3:
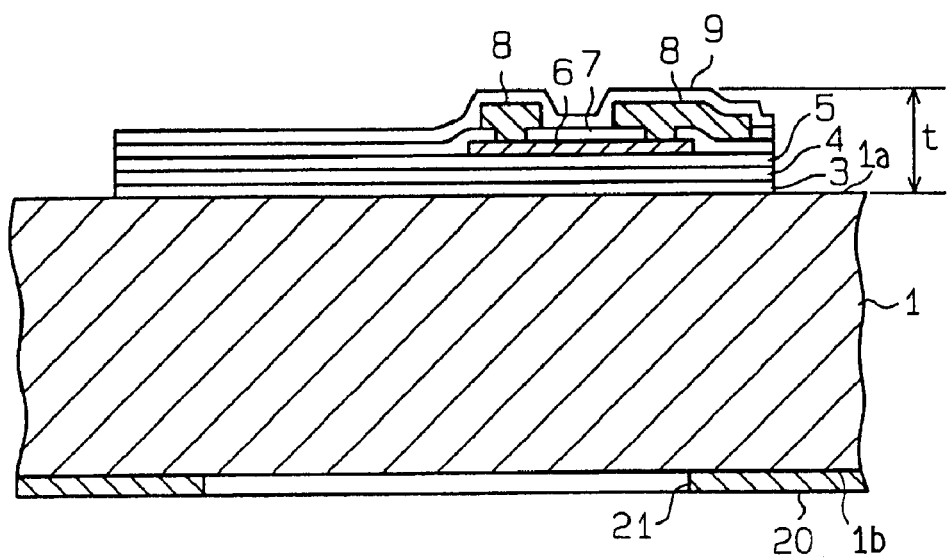
FIG. 3 is cross sectional view showing production processes of the thermo pile infrared ray sensor according to the first embodiment.

First, as shown in FIG. 3, a silicon wafer having first and second surfaces 1a, 1b is prepared as the substrate 1. The isolation layers 3–5 are formed on the first surface 1a of the substrate 1. Next, a silicon nitride layer 20 is formed on the second surface 1b of the substrate 1 as a mask to form the opening portion 2. A window portion 21 is then formed in the silicon nitride layer 20. The n-type poly-Si layer 6 is formed and patterned on the isolation layers 3–5 and the isolation layer 7 and the thin aluminium layer 8 is further formed and patterned thereon. The passivating layer 9 is formed on the thin aluminium layer 8 to cover respective elements of the infrared ray sensor.

Here, a total thickness (t) of the respective elements 3–9 is, for example, set approximately at 1.5 to 2.8 $\mu$m so as not to deform after the opening portion 2 is formed.

Figure 4:
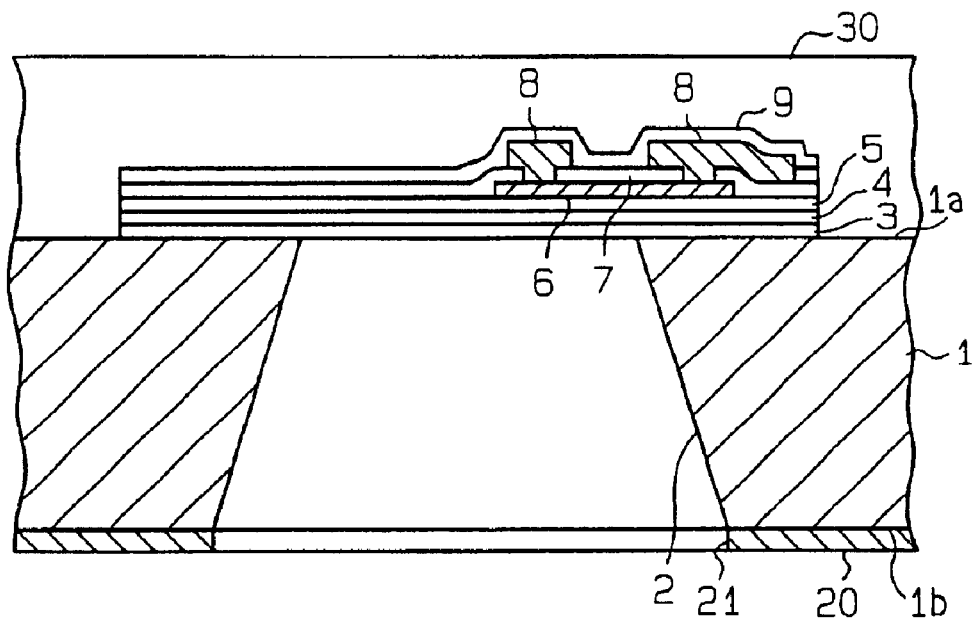
FIG. 4 is cross sectional view showing production processes of the electrical capacitance pressure sensor following FIG. 3.

As shown in FIG. 4, a protection layer 30 made of organic resin (resist material) is formed on a side of the first surface 1a of the substrate 1 to protect against etching liquid. Next, the opening portion 2 is formed in the substrate 1 by anisotropic etching through the silicon nitride layer 20. For example, the substrate 1 is immersed into alkali etching liquid such a potassium hydroxide solution. An etching amount is controlled based on an etching time and the etching is stopped when the silicon positioned at the opening portion is removed.

Figure 5:
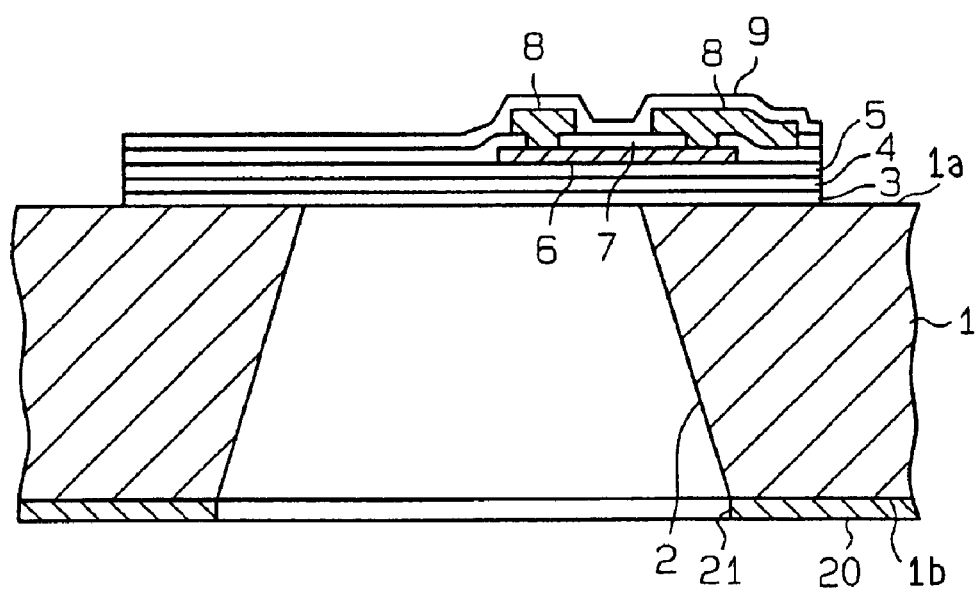
FIG. 5 is cross sectional view showing production processes of the electrical capacitance pressure sensor following FIG. 4.
Figure 6:
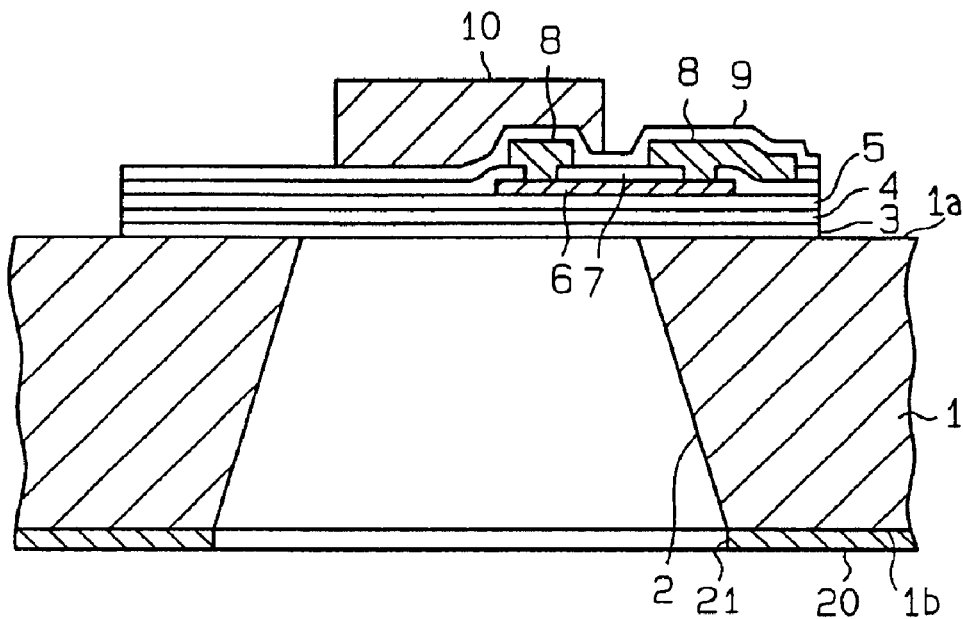
FIG. 6 is cross sectional view showing production processes of the electrical capacitance pressure sensor following FIG. 5.

As shown in FIG. 5, the etching protection layer 30 is removed. In this case, the infrared ray absorbent layer 10 has not been formed yet. Subsequently, as shown in FIG. 6, the infrared ray absorbent layer 10 is formed on a predetermined region of the passivating layer 9 by screen printing carbon paste and drying it. The screen printing is described with reference to FIG. 7.

In the present embodiment, an off contact type of screen printing is employed. A screen 41 installed in a screen frame 42 disposed above the wafer 40 and is slightly separated from a surface of the wafer 40. The screen 41 has a predetermined window portion. A carbon paste 43 is mounted on the screen 41 and is squeezed out from the window portion of the screen 41 by moving a squeezer 44 on the screen 41 with a predetermined squeezing pressure. Here, the squeezing pressure F3 applied on the wafer 40 (i.e., substrate 1) is at most 0.25 Mpa. This is because the respective elements 3–9 of the infrared ray sensor may be destroyed due to the squeezing pressure.

A polyester resin mixed with carbon particles is mixed with the carbon paste 43 to be used for the screen print. Specifically, a diameter of the carbon particles is approximately 2 to 3 $\mu$m to increase an infrared ray absorbency ratio, and a carbon addition ratio of the polyester resin is at least 20 wt %, and preferably 30 to 60 wt % to decrease an average surface roughness Ra of the infrared ray absorbent layer 10 at least 0.5 $\mu$m.

After screen printing, the substrate 1 is accommodated into a heater and is dried. Therefore, the infrared ray absorbent layer 10 is formed. Successively, the substrate 1 is separated by a dicing cutter, thereby completing the infrared ray sensor of the present embodiment.

The reasons for utilizing the numeric values of the squeeze pressure, the diameter of the carbon particle, the carbon dopant ratio of the polyester resin and the average surface roughness Ra are described with reference to FIGS. 8–13.

Figure 8:
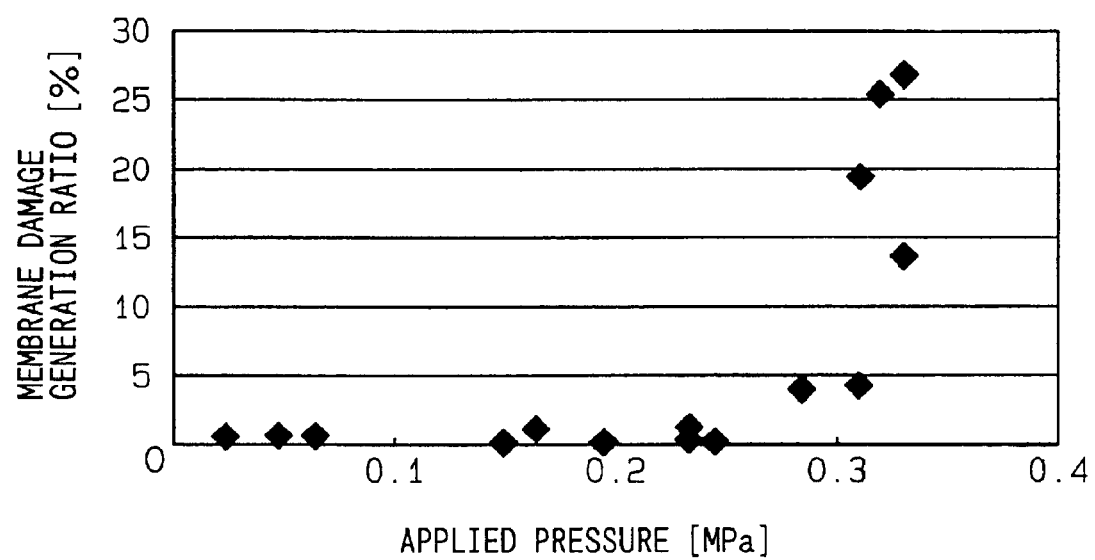
FIG. 8 is a graph showing a relationship between applied pressure during screen printing and a membrane damage generation ratio.

FIG. 8 shows investigation results regarding the above described screen printing. A horizontal axis shows pressure F3 applied to the substrate 1 during the screen printing, and a longitudinal axis shows a membrane damage generation ratio. The pressure F3 is equal to downward force expressed with a value that is equal to a squeezer pressure F1 subtracted from a restitution force F2, where the squeezer pressure F1 is a pressure force applied the screen 41 by the squeezer 44 and the restitution force F2 is an elastic force of the screen 41 for becoming restored to its original state. In this investigation, a thickness of the membrane t (i.e., total thickness of the respective layers 3–9) is 1.5 to 2.8 $\mu$m and the Length and breadth sizes of the opening portion 2 are approximately 1 mm respectively.

Referring to FIG. 8, it can be understood that the membrane damage generation ratio considerably increases when the pressure F3 during the screen print is 0.25 MPa or more. Therefore, it is preferable to set the pressure applied to the substrate 1 (membrane) to at most 0.25 MPa during the formation of the infrared ray absorbent layer 10.

FIGS. 9A and 9B show print conditions when a polyester resin paste that is a polyester resin including carbon particles and a phenol resin paste that is a phenol resin including carbon particles are printed. An average diameter of the added carbon particles is 2 to 3 $\mu$m to increase an infrared ray absorbency ratio. Referring to FIGS. 9A and 9B, it is evident that the polyester resin paste is superior to the phenol resin paste for screen printing purposes.

When a patterning of the screen print is conducted with a paste including a phenol resin (or a polyamide resin, a polyimide resin, an epoxy resin, or an acrylic resin) including with carbon particles (graphite), painting performance and adhesiveness to glass family materials such as silicon family layers including a TEOS layer or the like that are used for the surface of the infrared ray sensor are not good. That is, a patterned shape of the printed paste is not good if length and breadth sizes thereof are 1 mm respectively, which is the same as that of the infrared ray absorbent layer 10.

To the contrary, in this present embodiment, a polyester resin having good painting performance and an adhesiveness to glass family materials that are used for surface of the infrared ray sensor is employed to material of the infrared ray absorbent layer 10 formed by screen printing. Also, carbon is added to the polyester resin paste to increase the infrared ray absorbency ratio. Therefore, it is possible to form the infrared ray absorbency layer having a high infrared ray absorbency ratio and good resulting printed shape and at low cost.

The infrared ray absorbency ratio, the infrared ray transmission ratio and an infrared ray reflection ratio in sum equal 100%. Accordingly, it is necessary that the infrared ray transmission ratio and the infrared ray reflection ratio decrease to increase the infrared ray absorbency ratio. FIG. 10 shows a relationship between a carbon addition ratio and the infrared ray transmission ratio. Referring to FIG. 10, as the carbon addition ratio in the paste increases, the infrared ray transmission ratio decreases. This is because the percentage of infrared rays absorbed by the carbon increases. Especially, the infrared ray transmission ratio considerably decreases if the carbon addition ratio is at least 20 wt %.

Figure 11:
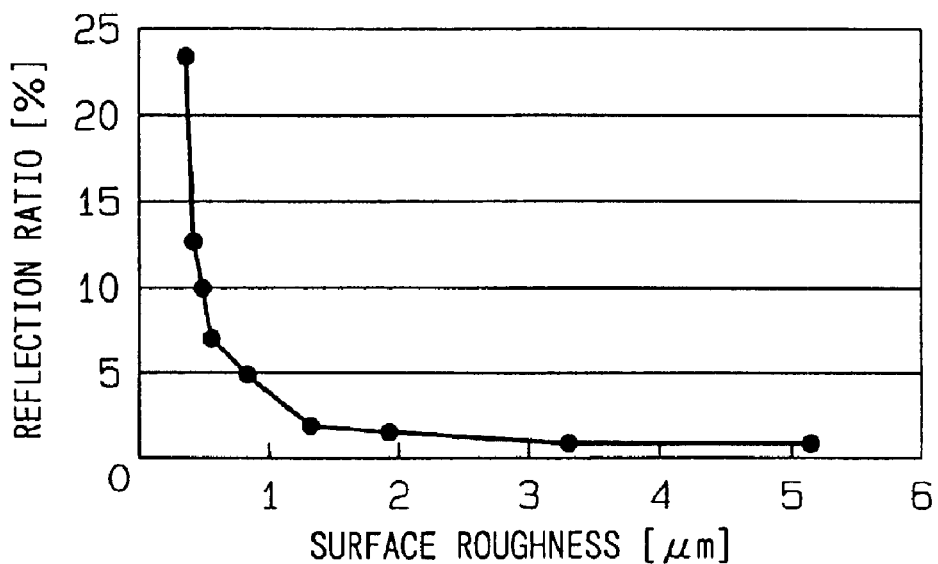
FIG. 11 is a line graph showing a relationship between surface roughness and a reflection ratio.

FIG. 11 shows a relationship between surface roughness (center line average roughness Ra: JIS B0601-1994) of the infrared ray absorbent layer and the infrared ray reflection ratio thereof. The infrared ray reflection ratio decreases as the surface roughness increases because multiple reflections on the surface of the infrared ray absorbent layer 10 increase. Especially, the infrared ray reflection ratio is at most 10% when the surface roughness is at least 0.5 $\mu$m.

Figure 12:
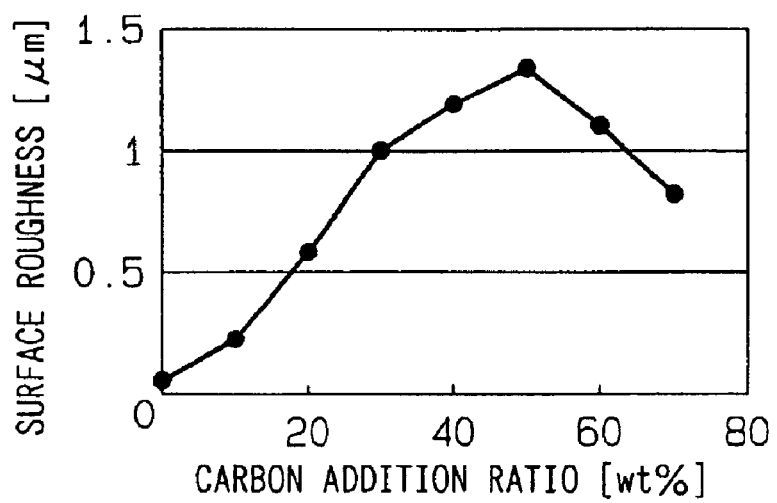
FIG. 12 is a line graph showing a relationship between a carbon addition ratio and surface roughness.

FIG. 12 shows a relationship between the carbon addition ratio and the surface roughness. Referring to FIG. 12, the surface roughness changes based on the carbon addition ratio. The surface roughness is at least 0.5 $\mu$m when the carbon addition ratio is at least 20 wt %. Accordingly, the infrared ray reflection ratio can be lower when the carbon addition ratio is at least 20 wt %.

However, the surface roughness decreases if the carbon addition ratio is further increased because spaces between the carbon particles are shortened as a density of the carbon in the infrared ray absorbent layer 10 increases. Therefore, it is preferable that the carbon addition ratio is not too high.

Figure 13:
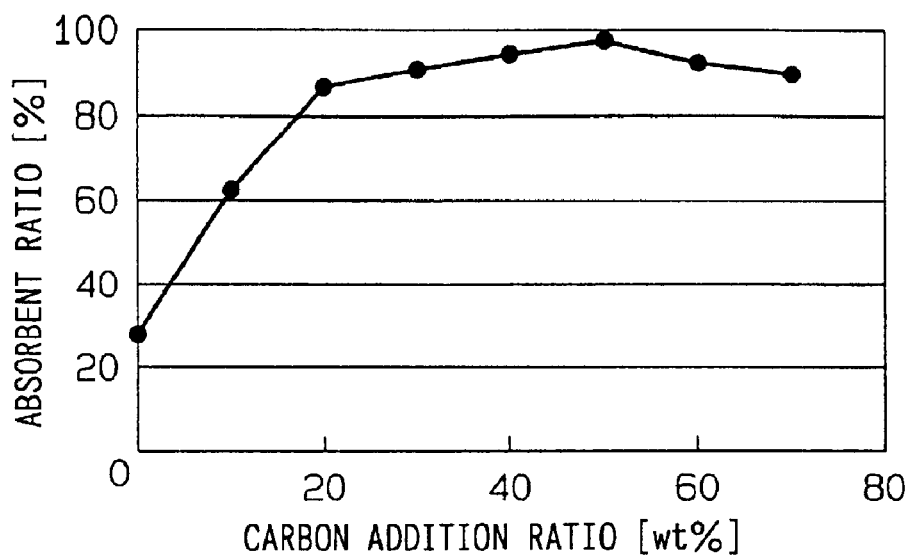
FIG. 13 is a line graph showing a relationship between a carbon addition ratio and an infrared ray absorbency ratio.

FIG. 13 shows a relationship between the carbon addition ratio and the infrared ray absorbency ratio. In the present investigation, a wavelength of the infrared ray is 10 $\mu$m. A thickness of the infrared ray absorbent layer 10 is at least 3 $\mu$m because an absorbent performance of an electromagnetic wave absorber increases when its thickness is at least one quarter of the electromagnetic wavelength.

Referring to FIG. 13, high infrared ray absorbency ratio can be obtained when the carbon addition ratio is at least 20 wt %. Especially, the infrared ray absorbency ratio is at least 90% when the carbon addition ratio is 30 to 60 wt %.

According to the present embodiment, it is possible to manufacture the infrared ray sensor at low cost without using expensive equipment such as a vacuum deposition apparatus, a photolithography machine and a dry etching machine. Also, an infrared ray absorbent layer 10 having a high infrared ray absorbency ratio and good pattern shape can be formed.

As mentioned above, the infrared ray sensor of the present embodiment has features as follows.

The opening portion 2 is formed by etching from the second surface 1b of the substrate 1 (FIG. 3) after the n-type poly-Si layer 6 and the thin aluminium layer 8 are formed on the first surface 1a of the substrate 1 (FIG. 4). The infrared ray absorbent layer 10 is then formed on the side of the first surface 1a of the substrate 1 with screen paint (FIG. 6).

In the case that the opening portion 2 is formed after the infrared ray absorbent layer 10 is formed, the infrared ray absorbent layer 10 may peel from the substrate 1 when the protection layer 30 (FIG. 4) is removed.

However, according to the present embodiment, the infrared ray absorbent layer 10 cannot peel from the substrate 1 because it is formed after the etching for the opening portion 2. Therefore, a complex manufacturing process required to prevent peeling of the infrared ray absorbent layer 10 is not needed, and the infrared ray sensor can be manufactured with low cost.

Forming processes of the n-type poly-Si layer 6 and the thin aluminium layer 8 and an etching process for the opening portion 2 is practiced in a clean room, while a forming process of the infrared ray absorbent layer 10 is practiced outside of the clean room.

In the case that the respective processes mentioned above are practiced in the clean room, the clean room is polluted by the forming process of the infrared ray absorbent layer 10. However, the present embodiment can prevent the clean room from being polluted because the infrared ray absorbent layer 10 is formed outside of the clean room via screen printing.

During screen printing, a pattern shape of the infrared ray absorbent layer 10 is formed on the screen 41. That is, the infrared ray absorbent layer 10 is simultaneously completed when the screen printing is conducted. Accordingly, a photolithography machine and dry etching machine for patterning an infrared ray absorbent layer 10 formed by vacuum deposition is not needed in the present embodiment. Therefore, the infrared ray absorbent layer 10 can be formed by a screen printing machine that is less expensive than a vacuum deposition apparatus, and therefore the infrared ray sensor can be manufactured at low cost.

The squeezing pressure to be applied to the substrate 1 during the screen printing is at most 0.25 MPa. Therefore, it is preferable to form the infrared ray absorbent layer 10 after etching to avoid damaging the membrane.

The carbon paste 43 made of polyester with carbon particles is used for forming the infrared ray absorbent layer 10. Therefore, the infrared ray absorbent layer 10 can be formed with a accurate print shape. Also, the carbon addition ratio of the carbon paste 43 is at least 20 wt % (preferably 30 to 60 wt %). Therefore, the infrared ray absorbent layer 10 can be formed with a high infrared ray absorbency ratio. Further, the surface roughness of the infrared ray absorbent layer 10 is at least 0.5 $\mu$m. Therefore, the infrared ray absorbent layer 10 can be formed with a low infrared ray reflection ratio. Accordingly, when carbon paste made of polyester with carbon particles whose carbon addition ratio is 30 to 60 wt %, and when the surface roughness of the infrared ray absorbent layer 10 at least 1 $\mu$m and its thickness is at least 3 $\mu$m, it is possible to form the infrared ray absorbent layer 10 having an infrared ray absorbency ratio of at least 90%.

Second Embodiment

Figure 14:
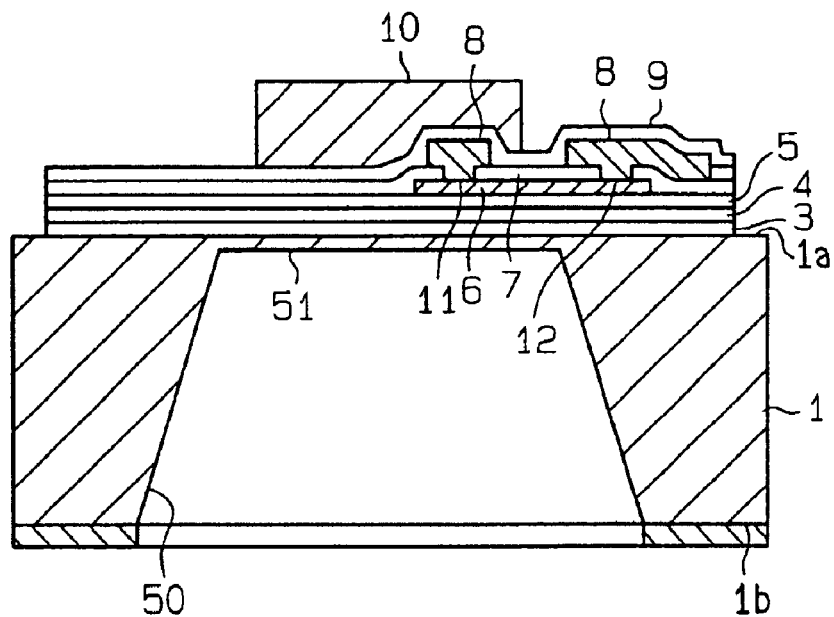
FIG. 14 is a cross sectional view showing a thermo pile infrared ray sensor of a second embodiment of the present invention.
Figure 15:
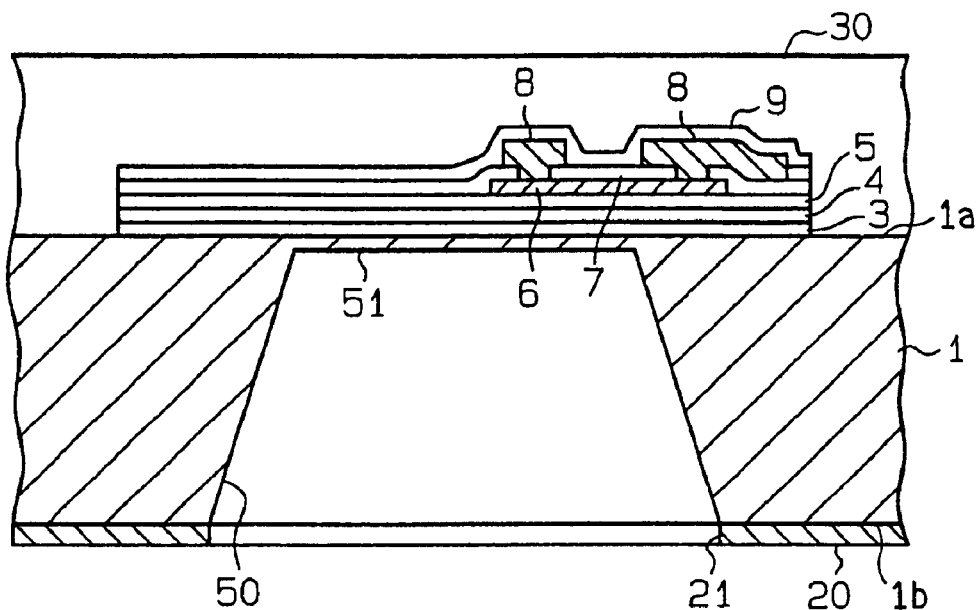
FIG. 15 is a cross sectional view showing a thermo pile infrared ray sensor of the second embodiment.

In the second embodiment shown in FIGS. 14 and 15, a thermo pile infrared ray sensor (infrared ray sensor) has a different construction from the first embodiment. As shown in FIG. 14, in this embodiment, the infrared ray sensor is modified with respect to that in the first embodiment.

In the infrared ray sensor, a depressed portion 50 is formed in the substrate 1. That is, a diaphragm 51 is formed in the substrate 1 on which the first connection portions 11 of the thermoelectric couples are formed. In this case, as shown in FIG. 15, an etching process for the depressed portion 50 is stopped before the etching proceeds through the first surface 1a of the substrate 1. Incidentally, a thickness of the diaphragm 51 is definable. It is, however, preferably as thin as possible because the thermo capacitance of the diaphragm 51 decreases as the thickness thereof decreases and a temperature difference between the first and second connection portions 11, 12 increases.

Third Embodiment

Figure 16:
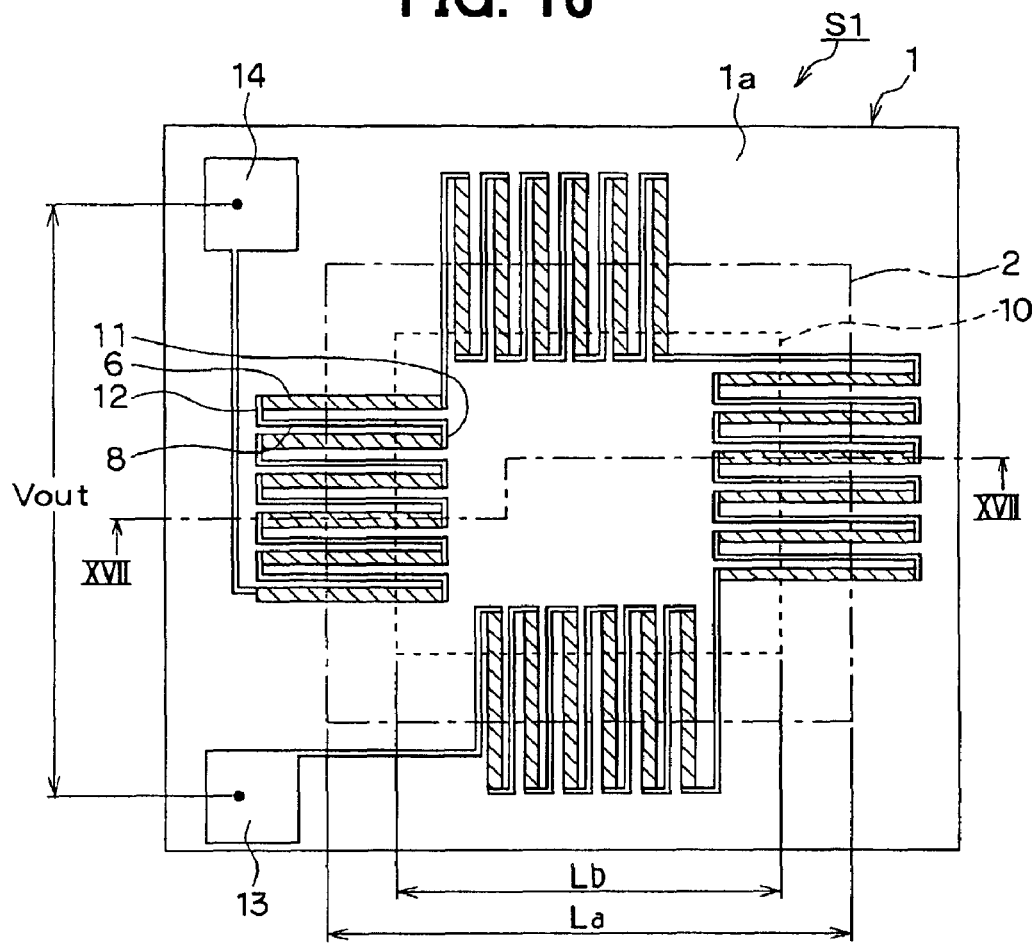
FIG. 16 is a front view showing a thermo pile infrared ray sensor according to a third embodiment of the present invention.
Figure 17:
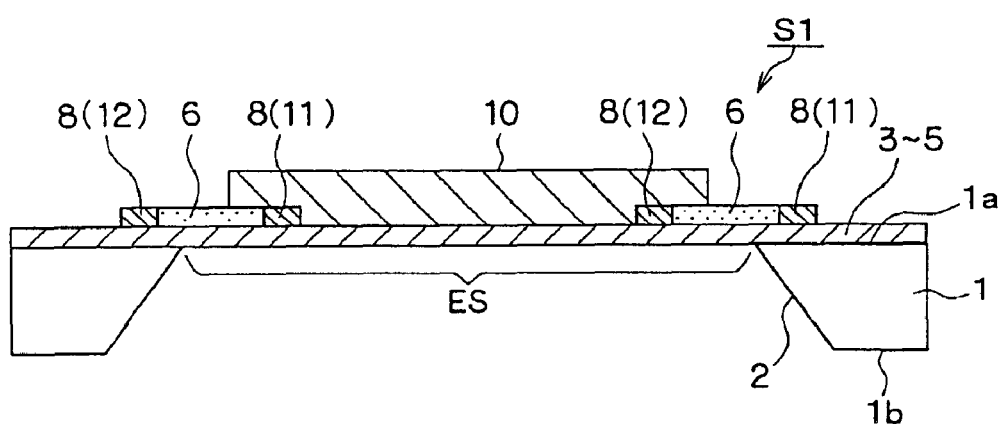
FIG. 17 is a cross sectional view taken along line XVIIB—XVIIB of FIG. 16.

In the third embodiment shown in FIGS. 16 and 17, sizes of the membrane and the infrared ray absorbent layer 10 are determined to obtain a larger output Vout of the thermo pile infrared ray sensor (infrared ray sensor) than that of the first embodiment.

Specifically, a ratio (size ratio) of Lb/La is determined to preferably be in a range of 0.75 to 0.90. In the infrared ray sensor, it is necessary to increase a temperature difference between the first and second connection portions 11, 12 to enlarge the sensor output Vout. The temperature difference T is shown in Equation (1) where the thermo resistance between the first and second connection portions 11, 12 is R, an infrared ray energy applied to the infrared ray sensor is I, the total area of the infrared ray absorbent layer 10 is S.

$$T=RIS \qquad (1)$$

According to Equation (1), the temperature difference T can be enlarged by increasing the thermo resistance R (i.e., thermo separate distance) or by increasing the size of the infrared ray absorbent layer 10. The size of the infrared ray absorbent layer 10 decreases as the thermo resistance R increases. On the other hand, the thermo resistance R decreases as the size of the infrared ray absorbent layer 10 increases. Therefore, the sensor output Vout can be enlarged based on the ratio of Lb/La.

Figure 18:
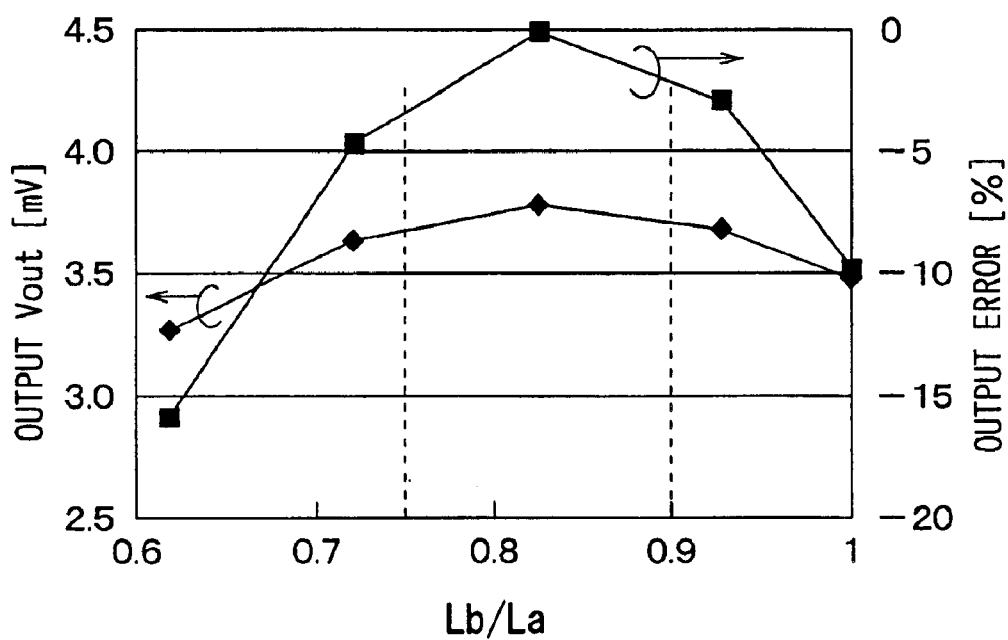
FIG. 18 is a line graph showing relationships between Lb/La and output error and between Lb/La and thermo pile output.

FIG. 18 shows results of a finite element modeling (FEM) analysis on a change of the sensor output Vout when the ratio Lb/La is altered. In this case, the ratio Lb/La is altered by altering the sizes Lb of the infrared absorbent layer 10 while maintaining the sizes La of the membrane (layers 3–9). The analysis is executed based on a temperature of an object for detection is 80° C.

Referring to FIG. 18, the sensor output Vout is shown as being greatest when the ration Lb/La is 0.82. FIG. 18 does not show the other data when the temperature of an object for detection is not 80° C., but the sensor output Vout is shown as being greatest when the ratio Lb/La is 0.82 as the same as the analysis.

FIG. 18 also shows output errors. The errors correspond to the percentage difference between the respective value of the sensor output Vout and the largest value thereof if the largest value of the sensor output Vout is standardized to 100%.

In the present embodiment, the infrared ray absorbent layer 10 is formed by screen printing. As mentioned above, the screen printing can be performed at low cost, but size errors and shape errors of the infrared ray absorbent layer 10 may be typically ±10% of the value of Lb if the infrared ray absorbent layer 10 is formed by screen printing. Accordingly, such an error range when the ratio Lb/La is 0.82 and the sensor output Vout is greatest, the sensor output Vout produces acceptable outputs when the ratio Lb/La is 0.75 to 0.90.

Further, it is preferable that the output error is at most ±3% of Lb in view of typical data processing circuit requirements. As shown in FIG. 18, a range where the ratio Lb/La is 0.75 to 0.90 satisfies the requested output error range. Therefore, in the present embodiment, the ratio Lb/La is set in a range of between 0.75 to 0.90.

According to the present embodiment, it is possible to increase the sensor output Vout by setting the ratio 0.75 to 0.90 without lengthening the sensor tip (i.e., the substrate 1) size.

Modification

In the first to third embodiments, carbon paste is used for forming the infrared ray absorbent layer 10. However, other materials can be alternatively used for forming the infrared ray absorbent layer 10.

Figure 7:
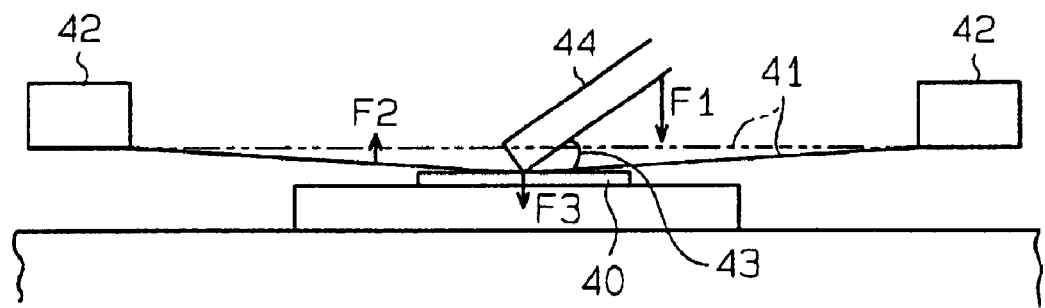
FIG. 7 is a schematic view showing a carbon paste print process according to the first embodiment.

Contact type screen printing can be alternatively employed for forming the infrared ray absorbent layer 10. In this case, the pressure F3 that is equal to the squeezer pressure F1 should be at most 0.25 MPa in order not to damage the membrane because the restitution force F2 is zero (FIG. 7).

As shown in FIG. 4, the side of the first surface 1a of the substrate 1 is covered with the protection layer 30 during the etching process for forming the opening portion 2. However, the protection layer 30 is not needed if the etching can be performed from only a side of the second surface 1b of the substrate 1. In this case, it is possible to reduce manufacturing cost of the infrared ray sensor because a forming process of the protection layer 30 and a removing process thereof are not needed.

In the third embodiment, sizes, shapes, materials or the like of the substrate 1, the membrane, the thermoelectric couples 11, 12, infrared ray absorbent layer 10 or the like can be alternatively changed.

While the above description is of the preferred embodiments of the present invention, it should be appreciated that the invention may be modified, altered, or varied without deviating from the scope and fair meaning of the following claims.

What is claimed is:

1. A manufacturing method for a thermo pile infrared ray sensor comprising:

preparing a substrate having first and second surfaces;

forming a first material layer dividing several parts on the first surface of the substrate with a first conductive material;

forming a second material layer having several parts with a second conductive material different from the first conductive material to form first and second connection portions with the several parts of the first material layer;

forming one of an opening portion and a depressed portion by etching the substrate from the second surface where the first connection portion is formed; and screen printing a carbon paste mixed with a polyester resin including carbon particles to form an infrared ray absorbent layer on the substrate to cover the first connection portion after the forming one of the opening portion and a depressed portion.

2. A method for manufacturing a thermo pile infrared ray sensor according to claim 1, wherein the screen printing the infrared ray absorbent layer includes screen printing the infrared ray absorbent layer so that a size ratio of a width of one of the opening and the depressed portion to a width of the infrared ray absorbent layer is 0.75 to 0.90.

3. A manufacturing method for a thermo pile infrared ray sensor comprising:

preparing a substrate having first and second surfaces;

forming a first material layer dividing several parts on the first surface of the substrate with a first conductive material;

forming a second material layer having several parts with a second conductive material different from the first conductive material to form first and second connection portions with the several parts of the first material layer;

forming one of an opening portion and a depressed portion by etching the substrate from the second surface where the first connection portion is formed; and screen printing an infrared ray absorbent layer on the substrate to cover the first connection portion after the forming one of the opening portion and a depressed portion, wherein the screen printing of the infrared ray absorbent layer includes screen printing the infrared ray absorbent layer so that a pressure applied on the substrate is at most 0.25 MPa.

4. A manufacturing method for a thermo pile infrared ray sensor comprising:

preparing a substrate having first and second surfaces;

forming a first material layer dividing several parts on the first surface of the substrate with a first conductive material;

forming a second material layer having several parts with a second conductive material different from the first conductive material to form first and second connection portions with the several parts of the first material layer;

forming one of an opening portion and a depressed portion by etching the substrate from the second surface where the first connection portion is formed; and screen printing a carbon paste with a carbon addition ratio that is at least 20 wt % and mixed with a polyester resin including carbon particles to form an infrared ray absorbent layer on the substrate to cover the first connection portion after the forming of one of the opening portion and a depressed portion.

5. A manufacturing method for a thermo pile infrared ray sensor comprising:

preparing a substrate having first and second surfaces;

forming a first material layer dividing several parts on the first surface of the substrate with a first conductive material;

forming a second material layer having several parts with a second conductive material different from the first conductive material to form first and second connection portions with the several parts of the first material layer;

forming one of an opening portion and a depressed portion by etching the substrate from the second surface where the first connection portion is formed; and screen printing a carbon paste with a carbon addition ratio that is 30 to 60 wt % and mixed with a polyester resin including carbon particles to form an infrared ray absorbent layer on the substrate to cover the first connection portion after the forming one of the opening portion and a depressed portion.

6. A manufacturing method for a thermo pile infrared ray sensor comprising:

preparing a substrate having first and second surfaces;

forming a first material layer dividing several parts on the first surface of the substrate with a first conductive material;

forming a second material layer having several parts with a second conductive material different from the first conductive material to form first and second connection portions with the several parts of the first material layer;

forming one of an opening portion and a depressed portion by etching the substrate from the second surface where the first connection portion is formed; and screen printing an infrared ray absorbent layer on the substrate so that a center line average roughness thereof is at least 0.5 $\mu$m to cover the first connection portion after the forming of one of the opening portion and a depressed portion.

* * * * *

UNITED STATES PATENT AND TRADEMARK OFFICE
CERTIFICATE OF CORRECTION

PATENT NO.         : 6,870,086 B2  
APPLICATION NO. : 10/164603  
DATED                 : March 22, 2005  
INVENTOR(S)        : Takahiko Yoshida, Yasutoshi Suzuki and Inao Toyoda It is certified that error appears in the above-identified patent and that said Letters Patent is hereby corrected as shown below:

Title Page Inventors

Correct the named inventors in item (75) to read as:

Takahiko Yoshida, Okazaki (JP);  
        Yasutoshi Suzuki, Okazaki (JP);  
        Inao Toyoda, Anjo (JP)

Signed and Sealed this

Nineteenth Day of December, 2006

JON W. DUDAS  
*Director of the United States Patent and Trademark Office*